United States Patent
Lung

(10) Patent No.: US 7,675,787 B2
(45) Date of Patent: Mar. 9, 2010

(54) TWO-BITS PER CELL NOT-AND-GATE (NAND) NITRIDE TRAP MEMORY

(75) Inventor: Hsiang-Lan Lung, Elmsford, NY (US)

(73) Assignee: MACRONIX International Co., Ltd., Hsinchu (TW)

( * ) Notice: Subject to any disclaimer, the term of this patent is extended or adjusted under 35 U.S.C. 154(b) by 95 days.

(21) Appl. No.: 12/123,302

(22) Filed: May 19, 2008

(65) Prior Publication Data

US 2008/0259691 A1  Oct. 23, 2008

Related U.S. Application Data

(62) Division of application No. 11/234,498, filed on Sep. 23, 2005, now Pat. No. 7,388,252.

(51) Int. Cl.
*G11C 16/04* (2006.01)

(52) U.S. Cl. .............. 365/185.28; 365/185.17; 365/185.24; 365/185.26; 365/185.27; 365/185.03

(58) Field of Classification Search ............ 365/185.28, 365/185.17, 185.24, 185.26, 185.27, 185.03
See application file for complete search history.

(56) References Cited

U.S. PATENT DOCUMENTS

| | | | | |
|---|---|---|---|---|
| 6,011,725 A * | 1/2000 | Eitan | ..................... | 365/185.33 |
| 6,181,597 B1 * | 1/2001 | Nachumovsky | ........ | 365/185.03 |
| 6,255,166 B1 * | 7/2001 | Ogura et al. | ................. | 438/257 |
| 6,388,293 B1 * | 5/2002 | Ogura et al. | ................. | 257/365 |
| 6,490,196 B1 * | 12/2002 | Hsu et al. | .............. | 365/185.03 |
| 6,512,263 B1 * | 1/2003 | Yuan et al. | ................... | 257/316 |
| 6,618,286 B2 * | 9/2003 | Kato et al. | ............. | 365/185.11 |
| 6,631,088 B2 * | 10/2003 | Ogura et al. | ........... | 365/185.18 |
| 6,735,118 B2 * | 5/2004 | Ogura et al. | ........... | 365/185.18 |
| 6,738,291 B2 * | 5/2004 | Kamei et al. | ........... | 365/185.18 |
| 6,807,105 B2 * | 10/2004 | Ogura et al. | ........... | 365/185.28 |
| 6,882,001 B2 * | 4/2005 | Pascucci | ..................... | 257/315 |
| 6,925,007 B2 * | 8/2005 | Harari et al. | ........... | 365/185.15 |
| 7,158,420 B2 * | 1/2007 | Lung | ....................... | 365/185.3 |
| 7,388,252 B2 * | 6/2008 | Lung | ......................... | 257/315 |

* cited by examiner

*Primary Examiner*—Viet Q Nguyen
(74) *Attorney, Agent, or Firm*—Jianq Chyun IP Office

(57) ABSTRACT

A non-volatile memory array includes a semiconductor substrate having a main surface, a first source/drain region and a second source/drain region. The second source/drain region is spaced apart from the first source/drain region. A well region is disposed in a portion of the semiconductor substrate between the first source/drain region and the second source/drain region. A plurality of memory cells are disposed on the main surface above the well region. Each memory cell includes a first oxide layer formed on the main surface of the substrate, a charge storage layer disposed above the first oxide layer relative to the main surface of the semiconductor substrate and a second oxide layer disposed above the charge storage layer relative to the main surface of the semiconductor substrate. A plurality of wordlines are disposed above the second oxide layer relative to the main surface of the semiconductor substrate.

5 Claims, 12 Drawing Sheets

TWO-BITS PER CELL NOT-AND-GATE (NAND) NITRIDE TRAP MEMORY

REFERENCE TO RELATED APPLICATIONS

This is a divisional of application Ser. No. 11/234,498, filed Sep. 23, 2005 now U.S. Pat. No. 7,388,252 incorporated herein by reference.

BACKGROUND OF THE INVENTION

The present invention relates to a non-volatile memory semiconductor device and a method for manufacturing a non-volatile memory semiconductor device, and more particularly, to a non-volatile memory semiconductor device having a two-bits per cell not-and-gate (NAND) nitride trap memory and a method for manufacturing a non-volatile memory semiconductor device having a two-bits per cell NAND nitride trap memory.

Non-volatile memory ("NVM") refers to semiconductor memory which is able to continually store information even when the supply of electricity is removed from the device containing such an NVM memory cell. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). Typically, NVM can be programmed with data, read and/or erased, and the programmed data can be stored for a long period of time prior to being erased, even as long as ten years.

Nitride read only memory (NROM) is a type of EEPROM that uses charge-trapping for data storage. An NROM cell is typically composed of a metal-oxide-silicon field effect transistor (MOSFET) having an ONO (oxide-nitride-oxide) layer disposed between the gate and the source/drain of the semiconductor material. The nitride layer in the ONO layer is able to "trap" charge (electrons) when the device is "programmed." Charge localization is the ability of the nitride material to store the charge without significant lateral movement of the charge throughout the nitride layer. NROM utilizes a relatively thick tunnel oxide layer, which typically negatively impacts the time it takes to erase a memory cell. NROM can be contrasted with conventional "floating gate" memory cells wherein the floating gate is conductive and the charge is spread laterally throughout the entire floating gate and charge is transferred through a tunnel oxide layer. Programming (i.e., charge injection) of the charge-trapping layer in NROM cells can be carried out by various hot carrier injection methods such as channel hot electron injection (CHE), source side injection (SSI) or channel initiated secondary electron (CHISEL) which all inject electrons into the nitride layer. Erasing is performed by applying a positive gate voltage, which permits hole tunneling through the ONO top dielectric layer from the gate. Erasing (i.e., charge removal) in NROM devices is typically carried out by band-to-band hot hole tunneling (BTBHHT). However, BTBHHT erasing causes many reliability issues with NROM devices and causes degradation of the NROM devices and charge loss after many program/erase cycles. Reading is carried out in a forward or reverse direction. Localized charge-trapping technology allows two separate bits per cell, thus resulting in a doubling of memory density. The NROM can be repeatedly programmed, read, erased and/or reprogrammed by known voltage application techniques.

NROM has attracted attention because of the two bits per cell operation and simple process flow for fabrication. However, NROM memory encounters fundamental limitations as the design is scaled down because of short channel effect and source/drain punch-through. A typical NROM memory is disclosed in U.S. Pat. No. 5,768,192 (Eitan '192), the contents of which is incorporated by reference herein. The source/drain of NROM is formed by Arsenic implantation into a P-well. The doping is heavy and the source/drain junction is deep in order to produce channel hot electron injection for programming and band to band hot hole for erasing. As result, even with virtual ground array architecture, the cell size of a NROM memory cell is about 8F2-10F2, where F is the feature size. The heavy and deep source/drain limits the scaling of the NROM cell. Further, the large hot electron programming current make it hard to parallel program on the order of kilobytes (kB) which limits the application for data flash.

Another common EEPROM is a metal-nitride-oxide-silicon (MNOS) memory cell. A typical MNOS cell includes a very thin layer of insulating material like silicon dioxide (SiO2) to separate a silicon nitride charge storage region from a gate and from a well region of the semiconductor device. MNOS devices are programmed by applying a positive voltage potential to the gate electrode while forcing the source, drain and well regions to a lower voltage potential. By applying a higher voltage to the gate, an electric field is created causing electrons in the well region and the rest of the semiconductor to tunnel through the oxide layer to the nitride layer. In order for the electrons to be able to tunnel through the oxide layer, the oxide layer must be relatively thin, e.g., 20-30 Angstroms (Å).

Yet another known EEPROM is a silicon-oxide-nitride-oxide-silicon (SONOS) memory cell. FIG. 1 depicts a typical conventional SONOS device 110. The conventional SONOS device 110 includes a silicon substrate 111, a source 114, a drain 112, a well region 115 and a first oxide layer 120 on top of the well region 115. A nitride charge storage layer 124 is provided above the first oxide layer 120 and a second oxide layer 130 is provided above the nitride charge storage layer 124. A polysilicon (poly) gate 125 is disposed on top of the ONO stack 120, 124, 130. By providing the second oxide layer 130 on top of the nitride layer 124 there is an improvement in the ability to control where the charge is stored or "trapped" within the nitride layer 124 during programming operations. Additionally, the second oxide layer 124 prevents holes from entering from the overlying gate 125. A non-volatile memory cell that utilizes asymmetric charge trapping is disclosed in Eitan '192.

U.S. Pat. No. 6,011,725 (Eitan '725), the entire contents of which is incorporated by reference herein, provides a detailed comparison of several of the prior art NVMs including respective programming, erasing and reading techniques. The Eitan '725 patent also discloses a type of SONOS memory cell capable of storing two data bits by localized charge storage techniques.

To program a first bit of typical conventional SONOS devices 110, a program voltage is applied to the drain 112 and to the gate 125 while the source 114 is grounded. The program voltage cause a vertical and lateral electric field along the length of the channel 105 from the source 114 to the drain 112. The electric field causes electrons to be drawn from the source 114 to the drain 112, and as the electrons move along a length of the channel 105, the electrons gain energy to "jump" the potential barrier posed by the bottom oxide layer 120 into the nitride charge storage layer 124 where they are "trapped" or stored. The accelerated electrons that make the jump are referred to as hot electrons. Since the nitride charge storage layer 124 is not really conductive, the electrons cannot spread throughout the nitride charge storage layer 124, but instead remain trapped in a local region closest to the drain 112. Similarly, to program a second bit of typical conventional SONOS devices 110, a program voltage is applied to the source 114 and to the gate 125 while the drain 112 is grounded. The program voltage cause a vertical and lateral electric field along the length of the channel 105 from the drain 112 to the source 114. The electric field causes electrons to be drawn from the drain 112 to the source 114, and as the electrons move along a length of the channel 105, the electrons gain energy to "jump" the potential barrier posed by the bottom oxide layer 120 into the nitride charge storage layer 124 where they are "trapped" or stored. Since the nitride charge storage layer 124 is not really conductive, the electrons cannot spread throughout the nitride charge storage layer 124, but instead remain trapped in a local region closest to the source 114. In order to be able to erase the memory, the programming duration must be limited because as the programming voltages continue to be applied, the width of the charge trapping region becomes wider and therefore harder to erase.

NAND flash memory has become the main stream technology for data flash application due to its smaller cell size and faster program speed and serial access. However, floating gate type NAND flash memory encounters fundamental limitations as the design is scaled down below 70 nanometers (nm). Besides its poor endurance, the interference effect due to parasitic capacitance between the adjacent floating gates severely deteriorates the cell threshold voltage distribution. Notably, SONOS NAND flash memory is free of such technological limitations generating below the design rule of 70 nm. However, SONOS NAND flash memory generally has poor charge retention which prevents SONOS NAND flash memory from being applied in high density NAND flash memory.

It is desirable to provide a non-volatile memory semiconductor device having a two-bits per cell NAND nitride trap memory. It is also desirable to provide an NVM having data retention that is better than SONOS NAND memory.

BRIEF SUMMARY OF THE INVENTION

Briefly stated, the present invention comprises a non-volatile memory array including a semiconductor substrate having a main surface, a first source/drain region in a portion of the semiconductor substrate proximate the main surface and a second source/drain region in a portion of the semiconductor substrate proximate the main surface. The second source/drain region is spaced apart from the first source/drain region. A well region is disposed in a portion of the semiconductor substrate proximate the main surface between the first source/drain region and the second source/drain region. A plurality of memory cells are disposed on the main surface of the substrate above the well region and between the first source/drain region and the second source/drain region. Each memory cell includes a first oxide layer formed on the main surface of the substrate, a charge storage layer disposed above the blocking oxide layer relative to the main surface of the semiconductor substrate and second oxide layer disposed above the charge storage layer relative to the main surface of the semiconductor substrate. The first oxide layer is disposed on a portion of the main surface proximate the well region. A plurality of wordlines are disposed above the second oxide layer relative to the main surface of the semiconductor substrate.

The present invention also comprises a method of programming a non-volatile memory cell in a memory array. The memory array includes a semiconductor substrate, a first source/drain region, a second source/drain region, a well region between the first source/drain region and the second source/drain region, a plurality of memory cells disposed on the semiconductor substrate between the first source/drain and the second source/drain, a plurality of wordlines associated with respective ones of the plurality of memory cells and a plurality of current control lines that are disposed on either side of each of the plurality of wordlines. Each memory cell includes a first oxide layer above the well region, a charge storage layer above the first oxide layer and a second oxide layer above the charge storage layer. The method includes applying a positive wordline programming voltage to the wordline over the respective memory cell to be programmed, applying a reference voltage to the well region and applying a current control line programming voltage to a current control line closest to the memory cell to be programmed on the side nearest the second source/drain region. The method further includes applying a source/drain programming voltage to the first source/drain region and coupling the second source/drain region to the reference voltage. The source/drain programming voltage is sufficient to cause electron tunneling from the second source/drain region through the well region toward the charge storage region to program a first bit.

The present invention also comprises a method of forming a non-volatile memory array including providing a semiconductor substrate having a main surface, forming a first source/drain region in a portion of the semiconductor substrate proximate the main surface and forming a second source/drain region in a portion of the semiconductor substrate proximate the main surface. The first source/drain region is spaced apart from the second source/drain region. A well region is defined in a portion of the semiconductor substrate proximate the main surface between the first source/drain region and the second source/drain region. A first oxide layer is deposited on the main surface of the substrate. The first oxide layer is disposed on a portion of the main surface proximate the well region. A charge storage layer is formed above the first oxide layer relative to the main surface of the semiconductor substrate. A second oxide layer is deposited above the charge storage layer relative to the main surface of the semiconductor substrate. Portions of the first oxide layer, the charge storage layer and the second oxide layer are etched away in order to form a plurality of individual memory cells disposed between the first and second source/drain regions. A plurality wordlines are formed that each interconnect a subset of the plurality of memory cells.

BRIEF DESCRIPTION OF THE SEVERAL VIEWS OF THE DRAWINGS

The foregoing summary, as well as the following detailed description of a preferred embodiment of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
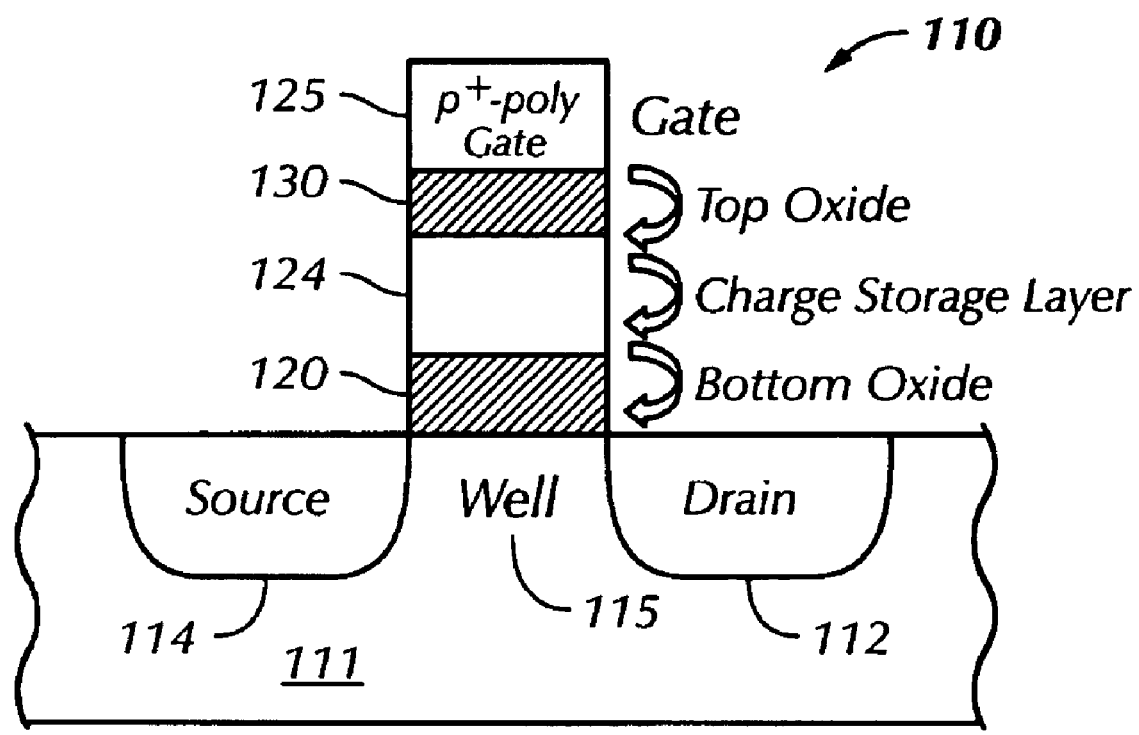
FIG. 1 is a partial sectional side elevational view of a conventional non-volatile memory (NVM) cell having a charge storage layer between oxide layers.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

One (1) micron or micrometer (μm) is 10,000 Angstroms (Å) or 1000 nanometers (nm).

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, n+ and p+ refer to heavily doped n and p regions, respectively; n++ and p++ refer to very heavily doped n and p regions, respectively; n− and p− refer to lightly doped n and p regions, respectively; and n−− and p−− refer to very lightly doped n and p regions, respectively. However, such relative doping terms should not be construed as limiting.

Referring to the drawings in detail, wherein like reference numerals indicate like elements throughout, there is shown in FIGS. 2 and 7-13 a non-volatile memory (NVM) NAND nitride trap memory semiconductor array 200 having two-bits Bit-A, Bit-B per memory cell 266 in accordance with the preferred embodiment of the present invention.

Figure 2:
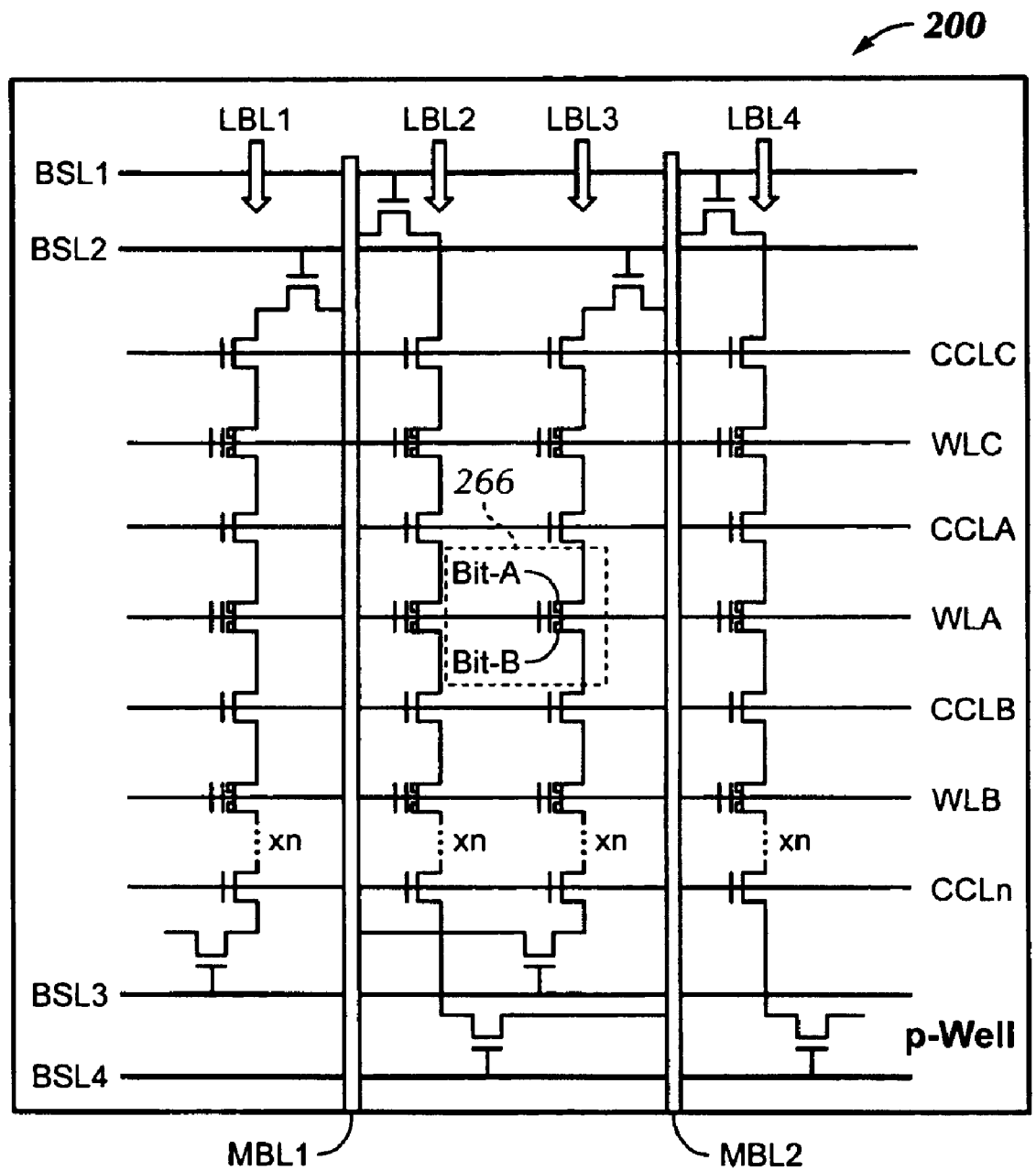
FIG. 2 is a schematic diagram of a non-volatile memory (NVM) array having two-bits per cell NAND nitride trap memory in accordance with the preferred embodiments of the present invention.

In particular, FIG. 2 shows a schematic diagram of the NVM array 200. The NVM array 200 comprises NAND nitride trap memory cells 266. Each of the memory cells 266 is configured to store two-bits Bit-A, Bit-B. The NVM array 200 includes a plurality of local bitlines LBL1, LBL2, LBL3, LBL4, a plurality of block select lines BSL1, BSL2, BSL3, BSL4, a plurality of wordlines WLA, WLB, WLC, a plurality of current control lines CCLA, CCLB, CCLC, CCLn and a plurality of metal bit lines MBL1, MBL2. Each of the wordlines WLA-WLC is separated from each of the current control lines CCLA-CCLn by a dielectric spacer 245 (FIGS. 6-7).

Preferably, the wordlines WLA-WLC are formed of doped or undoped polysilicon (poly) and are between about 500-1500 Å in thickness. Prefereably, the current control lines CCLA-CCLn are formed of doped or undoped polysilicon and are between about 500-1500 Å in thickness.

Figure 6:
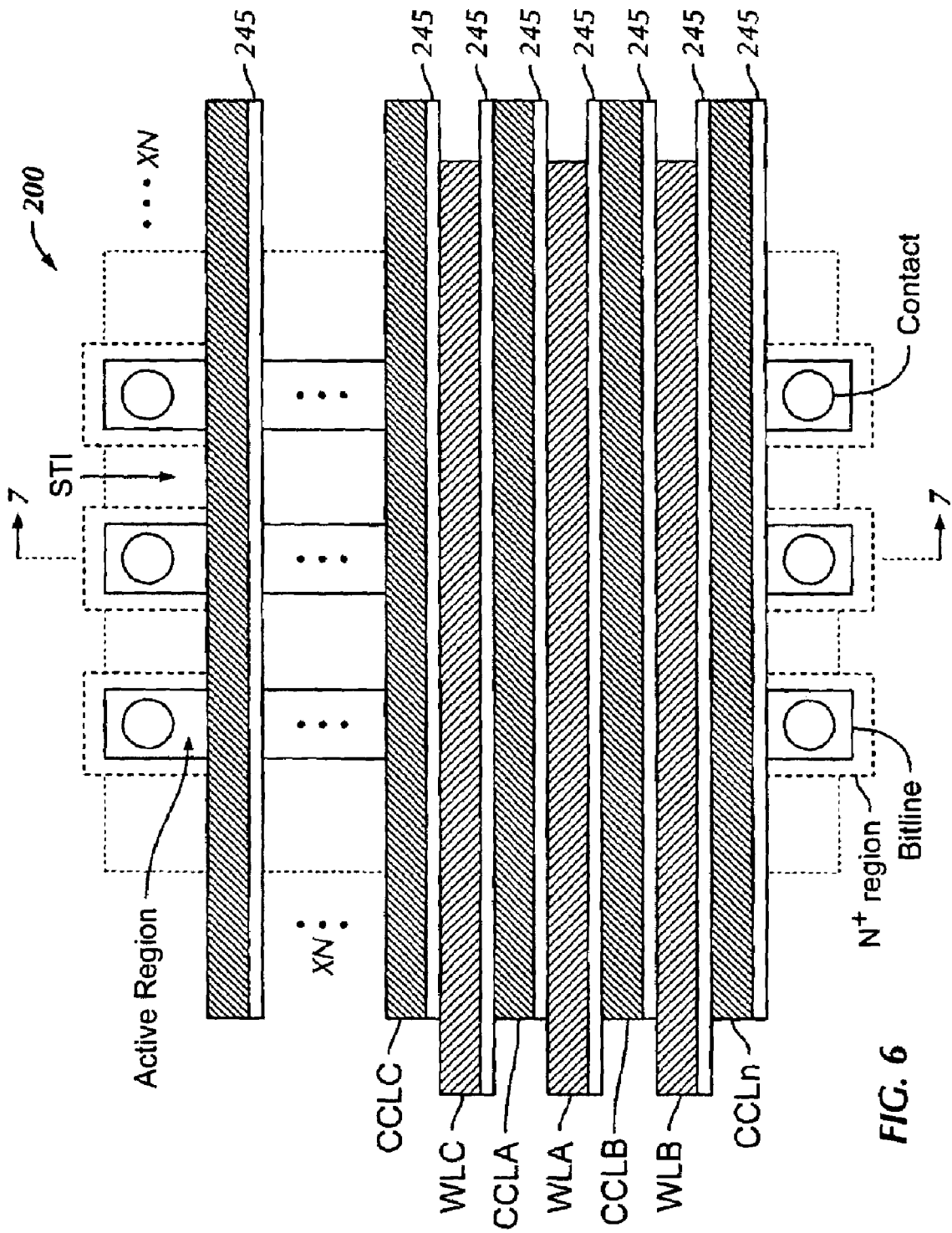
FIG. 6 is a top plan view of the array of FIG. 2.
Figure 7:
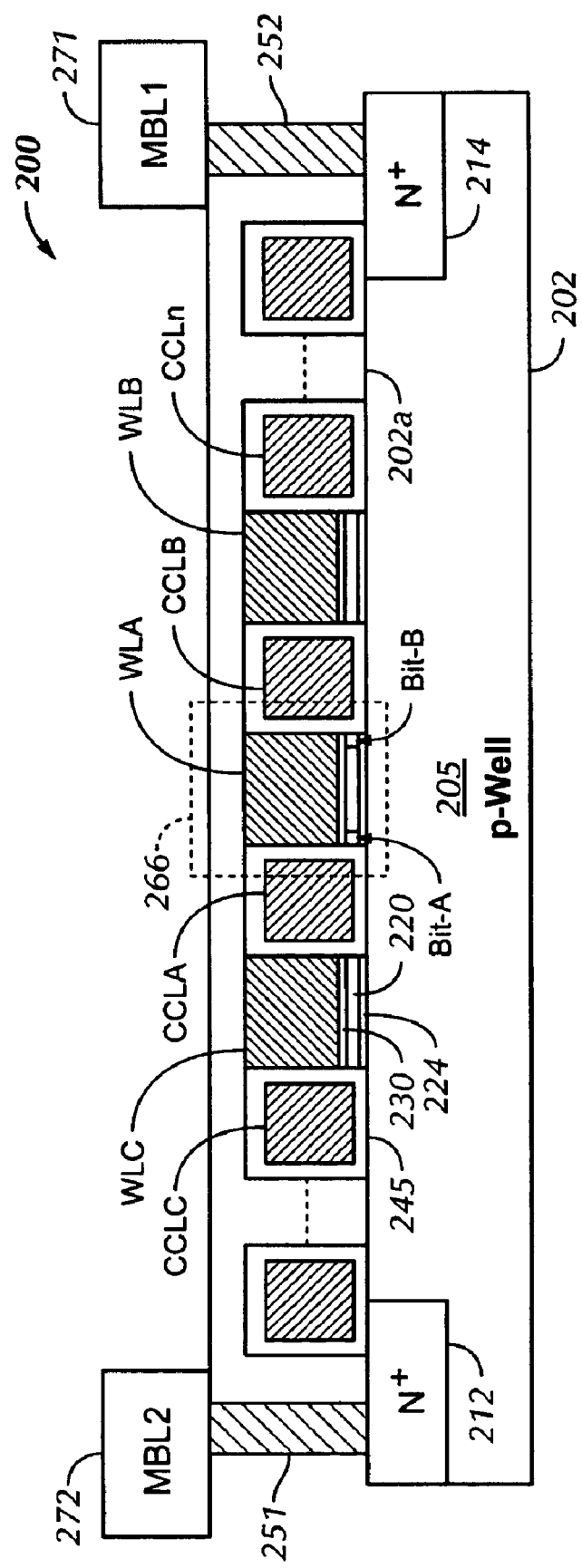
FIG. 7 is a partial sectional side elevational view of one local bitline of the array of FIG. 6 taken along line 7-7.

FIG. 6 is a top plan view of a portion of the NVM array 200. FIG. 7 is a partial sectional side elevational view of one local bitline of the array of FIG. 6 taken along line 7-7. As best shown in FIG. 7, the NVM array 200 includes a semiconductor substrate 202, a first source/drain 214, a second source/drain 212, a well region 205. Preferably, the semiconductor substrate 202 is undoped or doped silicon, but the semiconductor substrate 202 can be other semiconductor materials without departing from the embodiments of the present invention. Each memory cell 266 includes a first oxide layer 220 on top of the well region 205, a nitride charge storage layer 224 disposed above the first oxide layer 220 and a second oxide layer 230 disposed above the nitride charge storage layer 224. A respective wordline WLA-WLC is disposed on top of the oxide-nitride-oxide (ONO) stack 220, 224, 230 of each memory cell 266. The second oxide layer 230 electrically isolates the nitride charge storage layer 224 form the respective overlying wordline WLA-WLC, and therefore, prevents holes from entering from the overlying respective wordline WLA-WLC. The metal bitlines MBL1, MBL2 are coupled to the source/drain 212 and source/drain 214, respectively, through contacts 251, 252, respectively. The general region within the nitride charge storage layer 224 where the charge is stored for a first bit Bit-A and a second bit Bit-B is shown shaded with element numbers Bit-A, Bit-B, respectively. It should be understood that the shape of the region encompassed by the stored charge within the nitride storage layer 224 may or may not be as geometrically precise as depicted. It should be noted in FIG. 7 that the first and last current control lines CCLn overlap the first and second source/drain regions 214, 212 to ensure that the first and second source/drain regions 214, 212 connects to the inversion local bitline LBL1-LBL4.

The block selecting lines BSL1-BSL4 are used to switch the bias of the first source/drain 214 and the second source drain 212. The current control lines CCLA-CCLn control the programming current and also assist in inducing inversion of the first and second source/drain 214, 212.

Preferably, a dielectric layer 245 is formed of silicon oxide (SiOx) and is between about 70-150 Å in thickness. Preferably, the first oxide layer 220 is formed of silicon oxide (SiOx) and is between about 30-60 Å in thickness. For example, the first oxide layer 220 may be formed of silicon dioxide SiO2 and the like. Preferably, the nitride charge storage layer 224 is formed of a nonconducting nitride material and is between about 40-80 Å in thickness. For example, the nitride charge storage layer 224 may be formed of silicon nitride Si3N4 and the like. Of course, other generally nonconducting charge storage materials may be utilized for the charge storage layer 224. Preferably, the second oxide layer 230 is formed of silicon oxide (SiOx) and is between about 40-90 Å in thickness. For example, the second oxide layer 230 may be formed of silicon dioxide SiO2 and the like.

It should be recognized that the two bit memory cells 266 in accordance with the present invention are symmetrical. Therefore, the terms source and drain as used with conventional one bit devices may be confusing. During programming and reading operations, the source/drain 214 serves as the drain terminal and the source/drain 212 serves as the source terminal for the first bit Bit-A for each memory cell 266. Similarly, the source/drain 212 serves as the drain terminal and the source/drain 214 serves as the source terminal for the second bit Bit-B for each memory cell 266. Thus, it should be understood that the source and drain terminals 212, 214 for the second bit Bit-B are reversed as compared to the source and drain terminals 212, 214 for the first bit Bit-A.

Figure 8:
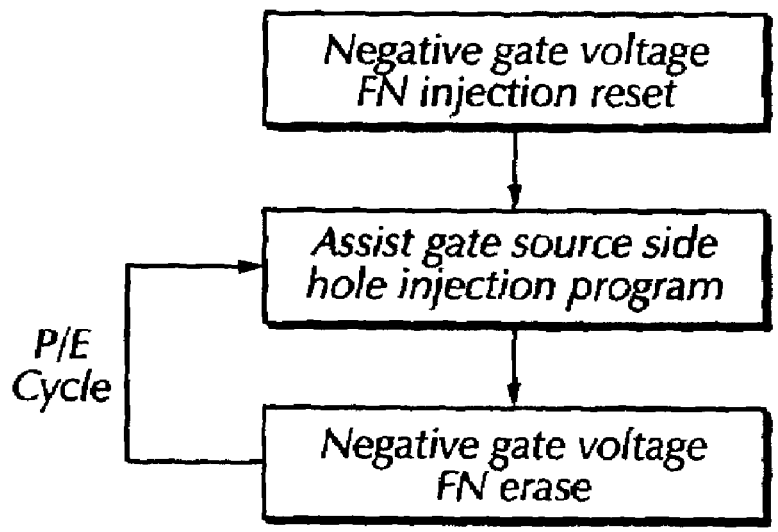
FIG. 8 is a flow diagram demonstrating a programming method in accordance with the preferred embodiments of the present invention.

In order to program the plurality of memory cells 266 for the first time, a negative Fowler-Nordheim (−FN) reset is needed to increase the Vt of all of the memory cells 266. FIG. 8 shows the steps for performing a negative gate voltage FN injection reset.

Figure 4:
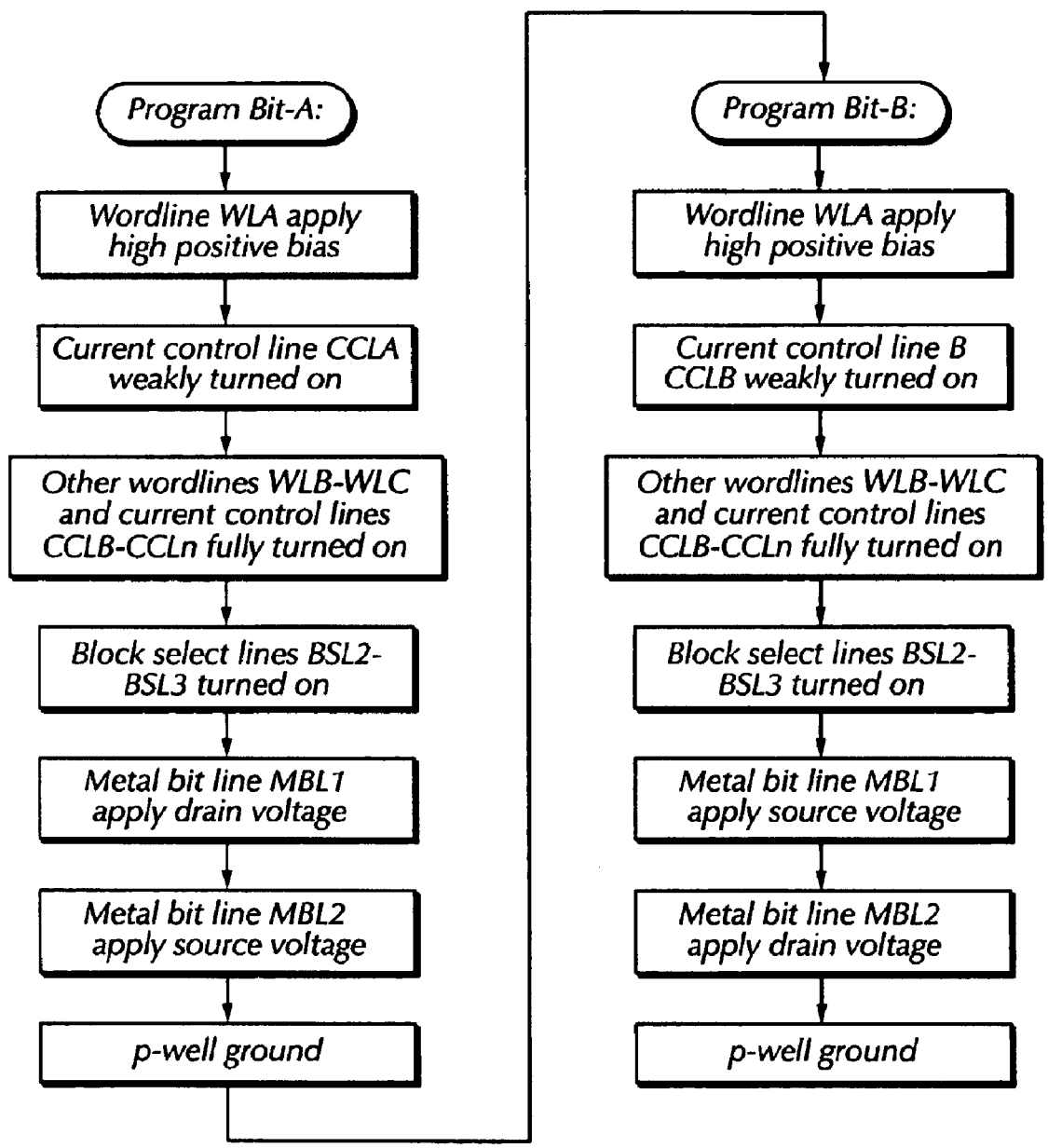
FIG. 4 is a flow diagram demonstrating a memory programming method in accordance with the preferred embodiments of the present invention.
Figure 9:
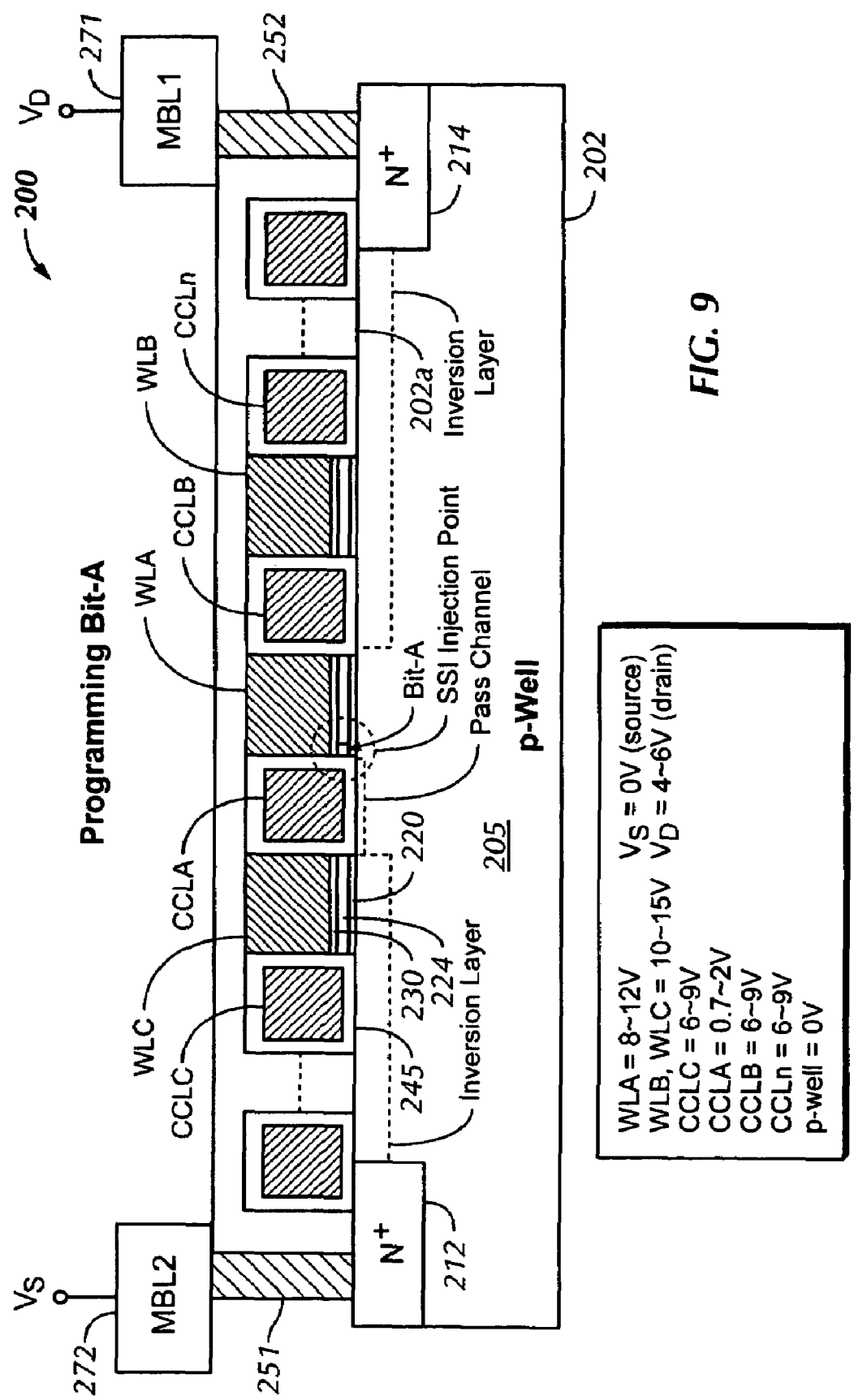
FIG. 9 is a partial sectional side elevational view of the NVM of FIG. 2 demonstrating programming of a first bit of a particular cell.
Figure 10:
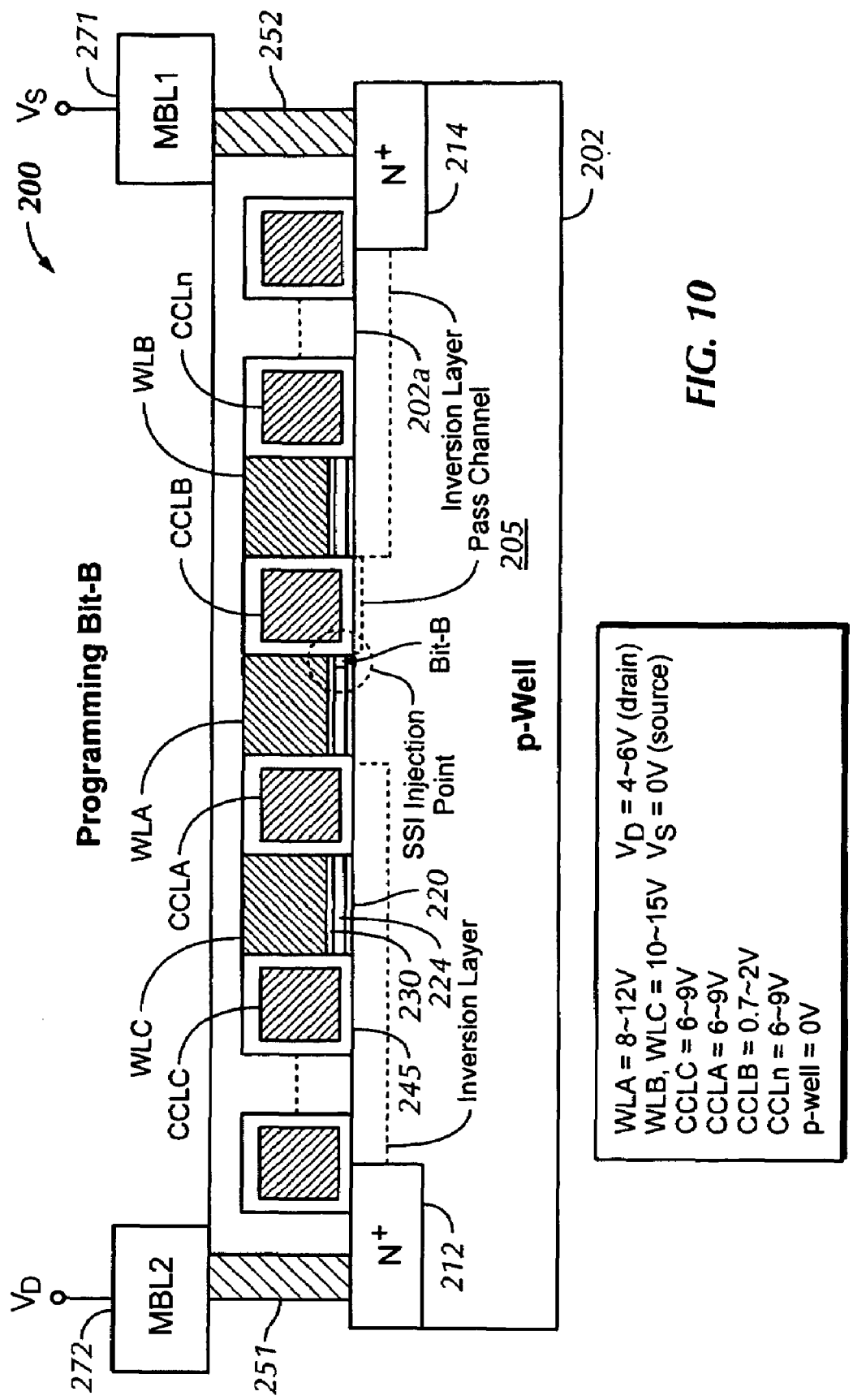
FIG. 10 is a partial sectional side elevational view of the NVM of FIG. 2 demonstrating programming of a second bit of a particular cell.

Referring to FIGS. 4 and 9-10, the steps for programming both bits Bit-A, Bit-B of one memory cell 266 will be described. The programming method is a LC source side injection (SSI) method.

To program the first bit Bit-A, a relatively high positive bias is applied to wordline WLA and current control line CCLA is relatively weakly turned on. For example, a programming voltage of about 8-12 volts direct current (DC) may be applied to wordline WLA and a voltage of about 0.7-2 VDC may be applied to current control line CCLA. The other word lines WLB-WLC and current control lines CCLB-CCLn are fully turned on. For example, the other word lines WLB-WLC may have about 10-15 VDC applied thereto, and the current control lines CCLB-CCLn may have about 6-9 VDC applied thereto. Block select line BSL2 and block select line BSL3 are turned on. A drain programming voltage is applied to metal bit line MBL1 and therefore to the source/drain region 214. The drain programming voltage may be between about 4-6 VDC. A source programming voltage is applied to metal bit line MBL2, and therefore to the source drain region 212. The p-well 205 is grounded (i.e., about zero VDC). The source programming voltage may be about ground or zero VDC. Thus, in this configuration, the source/drain region 212 functions as the source and source/drain region 214 functions as the drain for programming purposes. FIG. 9 diagrammatically shows that a pass channel is formed between the source/drain region 212 and the memory cell 266 under wordline WLA. The region within the nitride charge storage area 224 closest to the source/drain region 212 becomes the injection point where hot electrons are trapped thereby defining a programmed first bit Bit-A.

Similarly, to program the second bit Bit-B, a relatively high positive bias is applied to wordline WLA and current control line CCLB is relatively weakly turned on. For example, a programming voltage of about 8-12 volts direct current (DC) may be applied to wordline WLA and a voltage of about 0.7-2 VDC may be applied to current control line CCLB. The other word lines WLB and WLC and current control lines CCLA, CCLC-CCLn are fully turned on. For example, the other word lines WLB and WLC may have about 10-15 VDC applied thereto, and the current control lines CCLA, CCLC-CCLn may have about 6-9 VDC applied thereto. Block select line BSL2 and block select line BSL3 are turned on. A drain programming voltage is applied to metal bit line MBL2, and therefore to the source/drain region 212. The drain programming voltage may be between about 4-6 VDC. A source programming voltage is applied to metal bit line MBL1, and therefore to the source drain region 214. The p-well 205 is grounded (i.e., about zero VDC). The source programming voltage may be about ground or zero VDC. Thus, in this configuration, the source/drain region 214 functions as the source and source/drain region 212 functions as the drain for programming purposes. FIG. 10 diagrammatically shows that a pass channel is formed between the source/drain region 214 and the memory cell 266 under wordline WLA. The region within the nitride charge storage area 224 closest to the source/drain region 214 becomes the injection point where hot electrons are trapped thereby defining a programmed second bit Bit-B.

Figure 3:
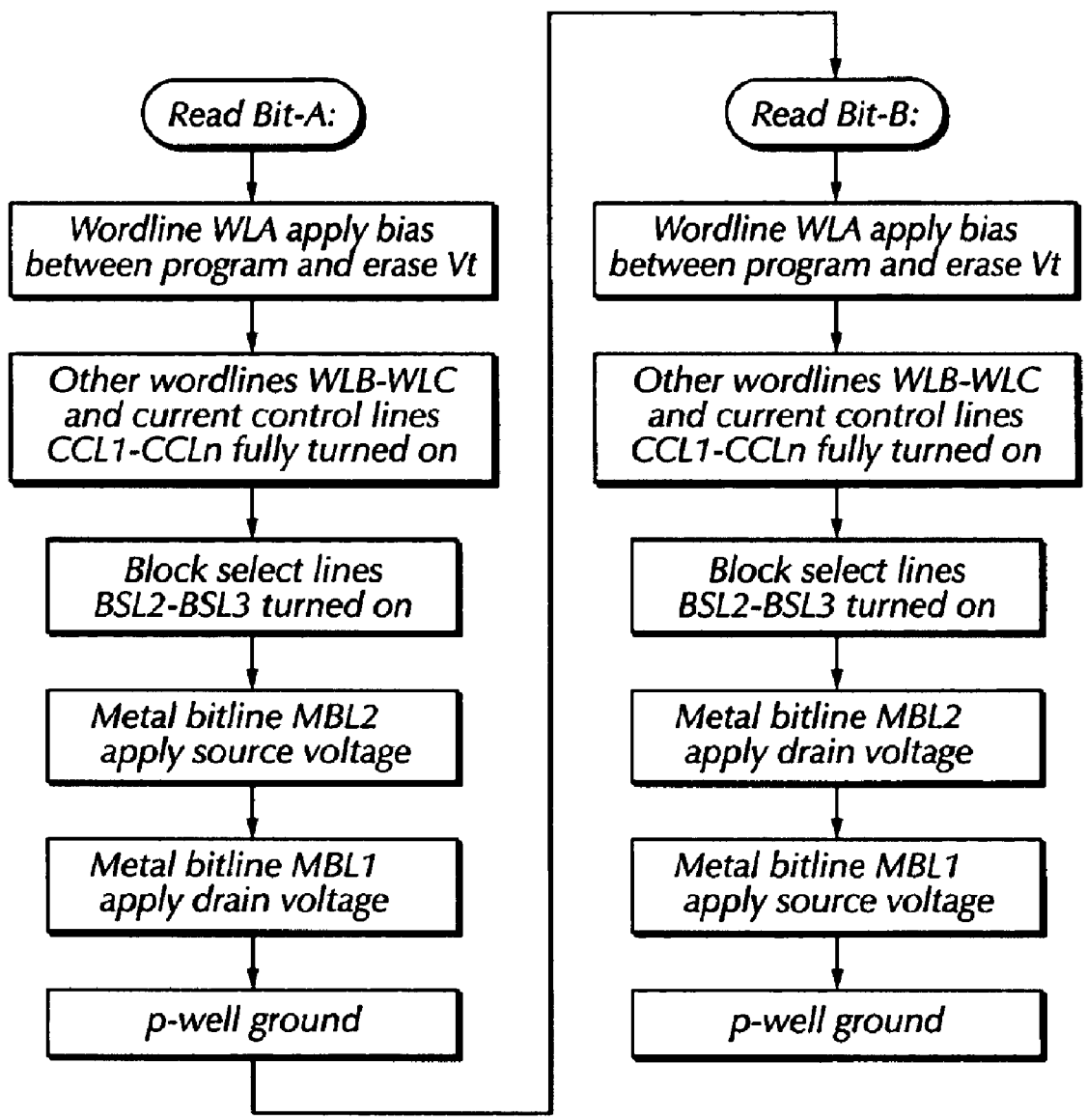
FIG. 3 is a flow diagram demonstrating a memory reading method in accordance with the preferred embodiments of the present invention.
Figure 11:
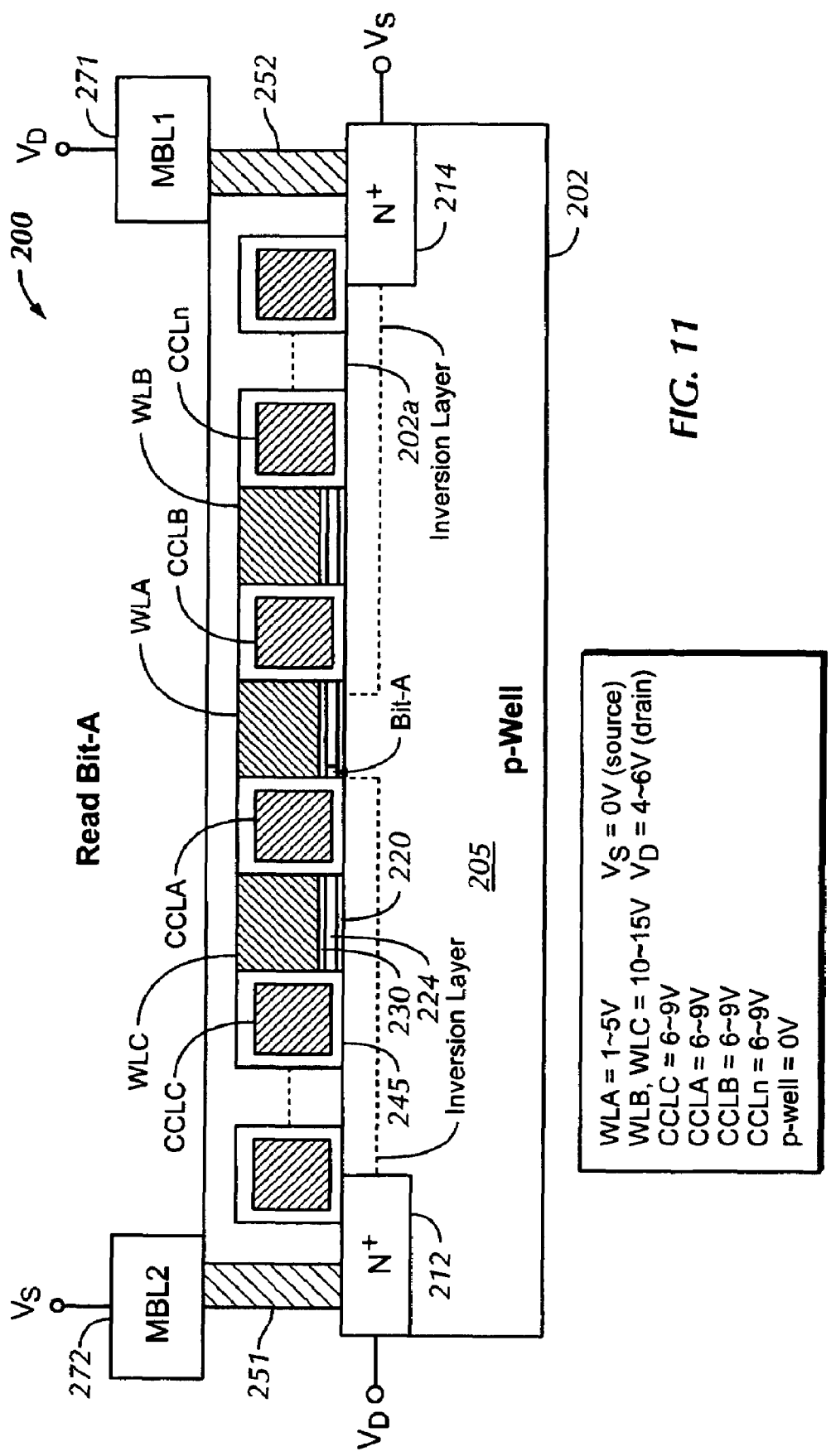
FIG. 11 is a partial sectional side elevational view of the NVM of FIG. 2 demonstrating reading of a first bit of a particular cell.
Figure 12:
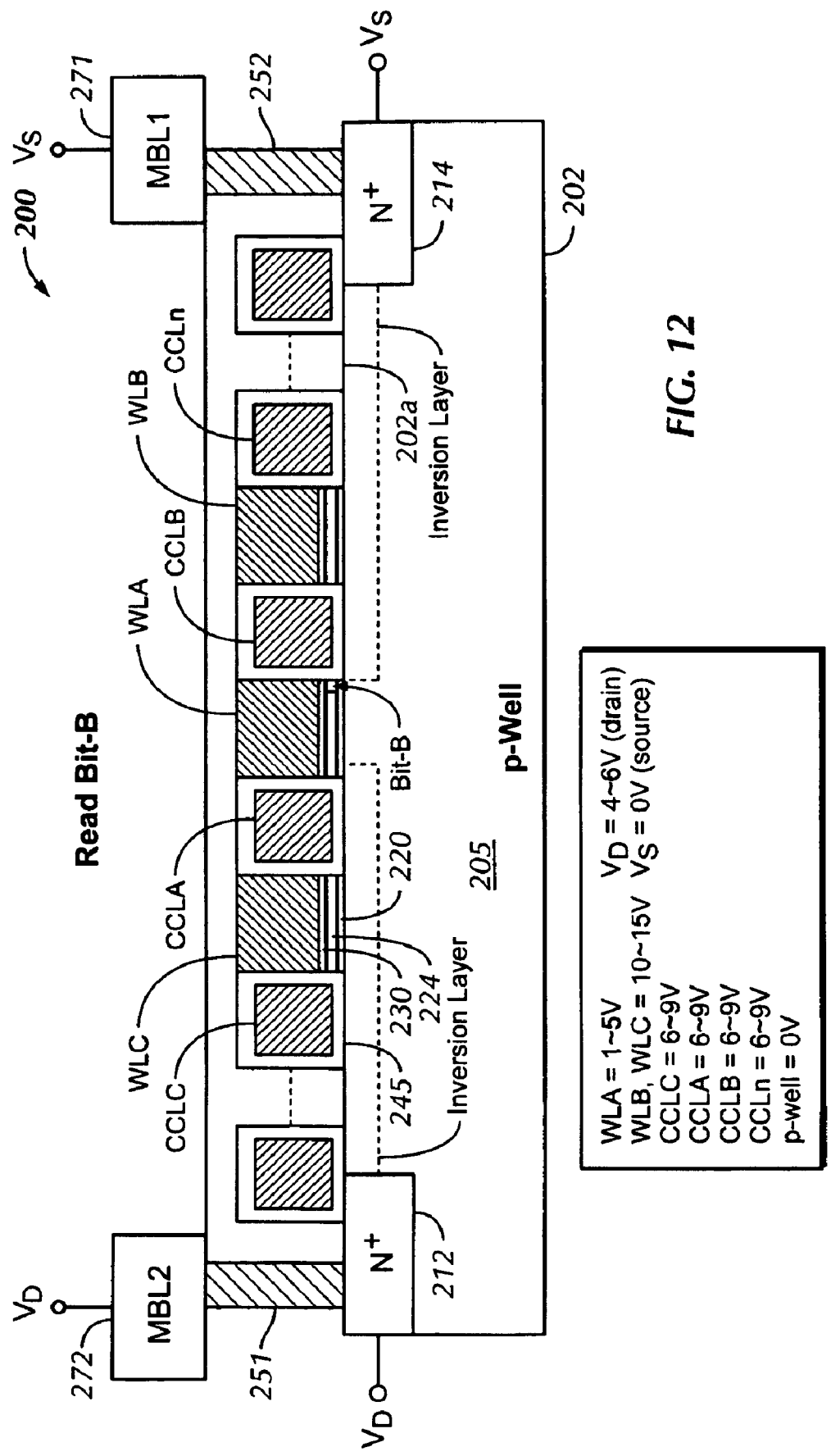
FIG. 12 is a partial sectional side elevational view of the NVM of FIG. 2 demonstrating reading of a second bit of a particular cell.

Referring to FIGS. 3 and 11-12, the steps for reading both bits Bit-A, Bit-B of one memory cell 266 will be described.

To read the first bit Bit-A, a read bias voltage is applied to wordline WLA that is between the program voltage and the erase voltage Vt. For example, the read bias voltage may be between about 1-5 VDC. The other wordlines WLB-WLC and the current control lines CCLA-CCLN are all fully turned on. For example, the other word lines WLB-WLC may have about 10-15 VDC applied thereto, and the current control lines CCLA-CCLn may have about 6-9 VDC applied thereto. The block select lines BSL2-BSL3 are turned on. A source voltage is applied to metal bitline MBL2, and therefore to the source/drain region 212. The source voltage may be about ground or zero VDC. A drain voltage is applied to metal bit line MBL1, and therefore to the source/drain region 214. The p-well 205 is grounded (i.e., about zero VDC). An electrical current in the channel 205 is then sensed. If the first bit Bit-A is programmed (i.e., logic 0), the current in the channel 205 will be very low, but if the first bit Bit-A is not programmed (i.e., logic 1), then the current in the channel 205 will be higher. By connecting the source/drain region 212 to reference or ground and connecting the source/drain region 214 to a positive voltage, a drain induced barrier lowering (DIBL) effect overcomes the electronic field barrier which was built by the injection of electrons if Bit-B was programmed.

Likewise, to read the second bit Bit-B, a read bias voltage is applied to wordline WLA that is between a program voltage and an erase voltage Vt. For example, the read bias voltage may be between about 1-5 VDC. The other wordlines WLB-WLC and the current control lines CCLA-CCLN are all fully turned on. For example, the other word lines WLB-WLC may have about 10-15 VDC applied thereto, and the current control lines CCLA-CCLn may have about 6-9 VDC applied thereto. The block select lines BSL2-BSL3 are turned on. A source voltage is applied to metal bitline MBL1, and therefore to the source/drain region 214. The source voltage may be about ground or zero VDC. A drain voltage is applied to metal bit line MBL2, and therefore to the source drain region 212. The p-well 205 is grounded (i.e., about zero VDC). The electrical current in the channel 205 is then sensed. If the second bit Bit-B is programmed (i.e., logic 0), the current in the channel 205 will be very low, but if the second bit Bit-B is not programmed (i.e., logic 1), then the current in the channel 205 will be higher. By connecting the source/drain region 214 to reference or ground and connecting the source/drain region 212 to a positive voltage, a DIBL effect prevents the second bit effect from occurring.

Figure 5:
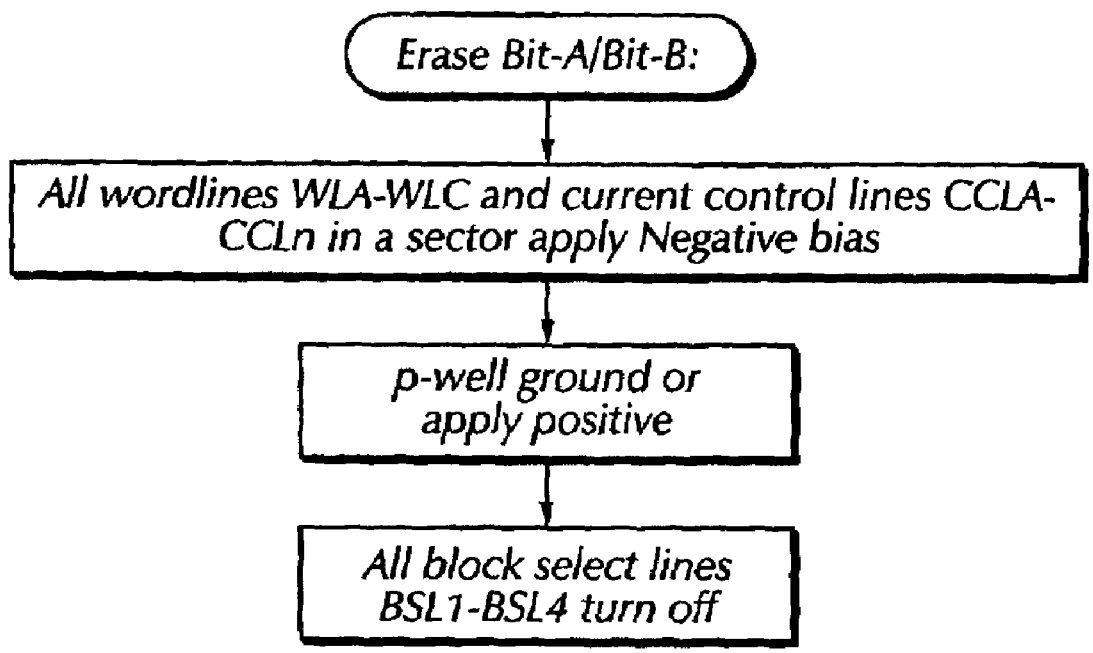
FIG. 5 is a flow diagram demonstrating a memory erasing method in accordance with the preferred embodiments of the present invention.
Figure 13:
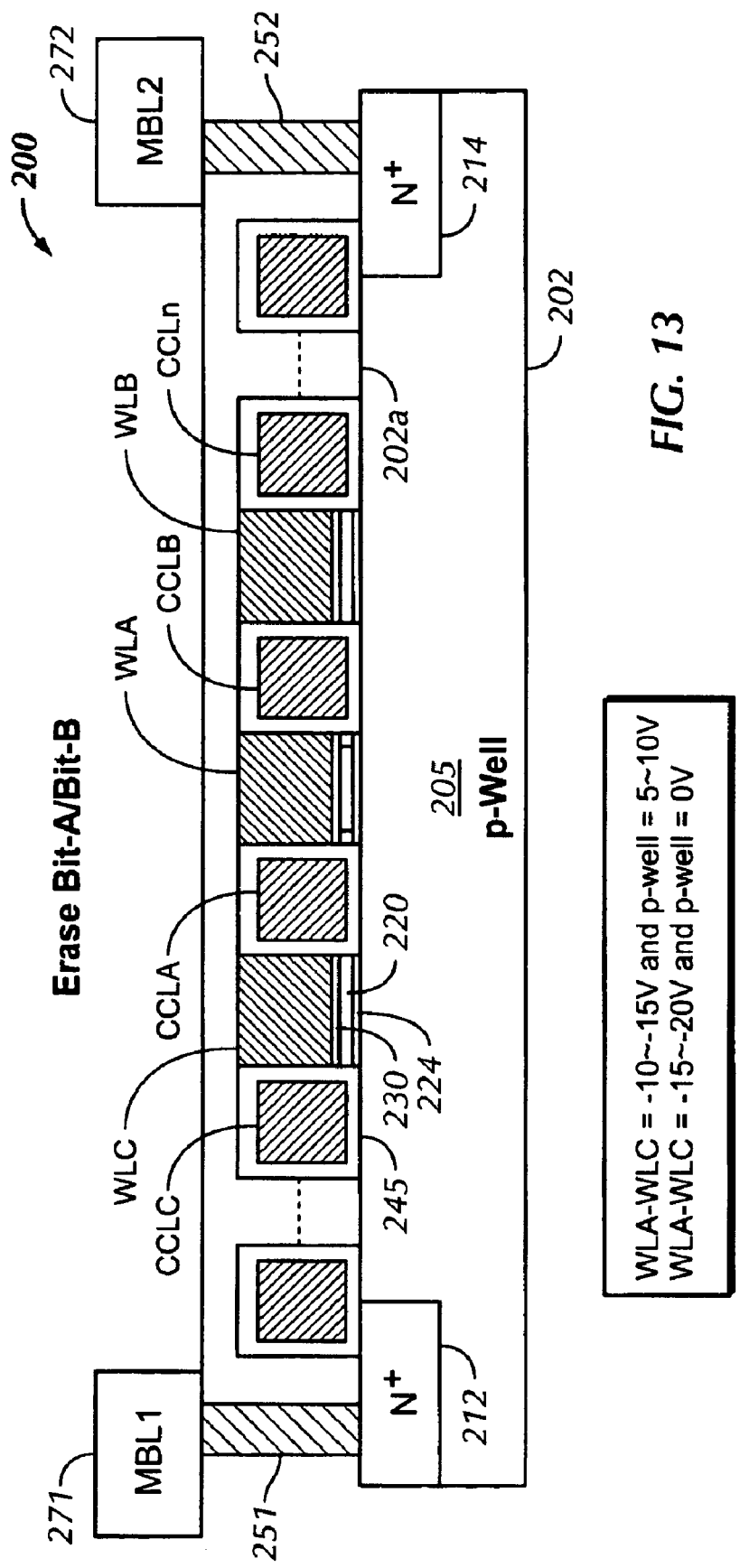
FIG. 13 is a partial sectional side elevational view of the NVM of FIG. 2 demonstrating erasing both first and second bits of a particular cell.

Referring to FIGS. 5 and 13, the steps for erasing both bits Bit-A, Bit-B of one memory cell 266 will be described.

To erase both the first and second bits Bit-A, Bit-B of a memory cell 266, a negative erase voltage is applied to all wordlines WLA-WLC and current control lines CCLA-CCLn in a sector. The p-well 205 is either grounded or a positive erase voltage is applied thereto. For example, if a voltage between about −10 to −15 VDC is applied to the wordlines WLA-WLC, then a positive voltage of between about 5-10 VDC is applied to the p-well 205. But, if a voltage between about −15 to −20 VDC is applied to the wordlines WLA-WLC, then the p-well 205 is grounded. The net result is a negative differential between the p-well 205 to the wordlines of about −15 to −20 VDC. All of the block select lines BSL1-BSL4 are turned off.

The present invention also includes a method of forming a non-volatile memory array 200. Referring to FIG. 7, the method includes providing a semiconductor substrate 202 having a main surface 202a. A first source/drain region 214 is formed in a portion of the semiconductor substrate 202 proximate the main surface 202a. A second source/drain region 212 is formed in a portion of the semiconductor substrate 202 proximate the main surface 202a. The first source/drain region 214 being spaced apart from the second source/drain region 212. A well region 205 is defined in a portion of the semiconductor substrate 202 proximate the main surface 202a between the first source/drain region 214 and the second source/drain region 212. A first oxide layer 220 is deposited on the main surface 202a of the substrate 202 proximate the well region 205. A charge storage layer 224 is formed above the first oxide layer 220 relative to the main surface 202a of the semiconductor substrate 202. A second oxide layer 230 is deposited above the charge storage layer 224 relative to the main surface 202a of the semiconductor substrate 202. Portions of the first oxide layer 220, the charge storage layer 224 and the second oxide layer 230 are etched away in order to form a plurality of individual memory cells 266 disposed between the first and second source/drain regions 214, 212. A mask (not shown) may be used to perform the etching. A plurality wordlines WLA-WLC are formed that each interconnect a subset of the plurality of memory cells 266. A plurality of current control lines CCLA-CCLn are formed on each side of the plurality of wordlines WLA-WLC. An insulator 245 is deposited around the plurality of wordlines WLA-WLC and the plurality of current control lines CCLA-CCLn.

The NVM array 200 may be an N-channel device by making, likely by doping and/or implanting, the first and second source/drain regions 214, 212 both n-type regions and by leaving the well region 205 a p-type region in the semiconductor substrate 202. Alternatively, the NVM cell 200 may be a P-channel device by making, likely by doping and/or implanting, the first and second source/drain regions 214, 212 both p-type regions and by leaving the well region an n-type region. Alternately, trenches (not shown clearly) may be formed in the semiconductor substrate 202 for desired first and second source/drain regions 214, 212, and the trenches can then be refilled with a an n-type or p-type material depending on the material of the substrate 202 such as with a heavily doped n-type or p-type polysilicon and the like.

The various layers 220, 224, 230 and lines WLA-WLC, CCLA-CCLn, BSL1-BSL4, LBL1-LBL4 may be formed in any of a variety of ways known in the art. For example, the various layers 220, 224, 230 may be grown or deposited. Deposition may be by chemical vapor deposition (CVD), physical vapor deposition (PVD), evaporation, sputtering and the like. Patterns may be formed on the surface of the semiconductor substrate by photolithography or photomasking ("masking") techniques. The various layers 220, 224, 230 and lines WLA-WLC, CCLA-CCLn, BSL1-BSL4, LBL1-LBL4 may be etched back by mechanical etching or by chemical etching and/or chemical mechanical polishing (CMP) and the like. A polysilicon layer may be deposited thereon and polished using CMP. Another photolithography or photomasking and etching step is performed to create the bitlines BSL1-BSL4 and the current control lines CLA-CCLn. An oxide filling or deposition step is performed to isolate the various bitlines BSL1-BSL4 and the current control lines CLA-CCLn from each other. Contacts 271, 272 are then formed by etching and metallization. Additionally, known methods of doping, heat treating, diffusing, etching, layering, trenching, polishing and the like, may be utilized in the fabrication process of the a NVM array 200 without departing from the present invention.

A NAND nitride trap memory array 200 in accordance with the preferred embodiments of the present invention is easily scalable due, at least in part, to a field induced inversion source/drain which is used to replace the implanted buried diffusion source/drain to improve over short channel effect and punch-through. A gate control low current source side hot electron injection programming method is used in the preferred embodiments to reduce the programming current and increase the programming speed. A negative gate voltage FN erase method is used with the preferred embodiments to increase the erasing speed and improve the data retention.

From the foregoing, it can be seen that the present invention is directed to a non-volatile memory semiconductor device having a two-bits per cell NAND nitride trap memory and a method for manufacturing a non-volatile memory semiconductor device having a two-bits per cell NAND nitride trap memory. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method of programming a non-volatile memory cell in a memory array, the memory array includes a semiconductor substrate, a first source/drain, a second source/drain, a well region between the first source/drain and the second source/drain, a plurality of memory cells disposed on the semiconductor substrate between the first source/drain and the second source/drain, a plurality of wordlines associated with respective ones of the plurality of memory cells, a plurality of current control lines that are each disposed between adjacent pairs of the plurality of wordlines, each memory cell includes a first oxide layer above the well region, a charge storage layer above the first oxide layer and a second oxide layer above the charge storage layer, the method comprising:
   applying a positive wordline programming voltage to the wordline over the respective memory cell to be programmed;
   applying a reference voltage to the well region;
   applying a current control line programming voltage to a current control line closest to the memory cell to be programmed on the side nearest the second source/drain region; and
   applying a source/drain programming voltage to the first source/drain region and coupling the second source/drain region to the reference voltage, the source/drain programming voltage being sufficient to cause electron tunneling from the second source/drain region through the well region toward the charge storage layer to program a first bit.

2. The method according to claim 1, further comprising:
   applying the current control line programming voltage to a current control line closest to the memory cell to be programmed on the side nearest the first source/drain region; and
   applying the source/drain programming voltage to the second source/drain region and coupling the first source/ drain region to the reference voltage, the source/drain programming voltage being sufficient to cause electron tunneling from the first source/drain region through the well region toward the charge storage layer to program a second bit.

3. The method according to claim 1, wherein the wordline programming voltage is between about 8-12 volts direct current.

4. The method according to claim 1, wherein the source/drain programming voltage is between about 4-6 volts direct current.

5. The method according to claim 1, wherein the current control line programming voltage is between about 0.7-2 volts direct current.

* * * * *